United States Patent
Kim et al.

(10) Patent No.: US 9,524,208 B2
(45) Date of Patent: Dec. 20, 2016

(54) MEMORY CONTROLLER OPERATING METHOD AND MEMORY CONTROLLER

(71) Applicants: Kyung-Jin Kim, Uiwang-si (KR);
Ung-Hwan Kim, Seongnam-si (KR);
Jun-jin Kong, Yongin-si (KR);
Nam-Shik Kim, Seoul (KR)

(72) Inventors: Kyung-Jin Kim, Uiwang-si (KR);
Ung-Hwan Kim, Seongnam-si (KR);
Jun-jin Kong, Yongin-si (KR);
Nam-Shik Kim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 173 days.

(21) Appl. No.: 14/322,404

(22) Filed: Jul. 2, 2014

(65) Prior Publication Data

US 2015/0178154 A1 Jun. 25, 2015

(30) Foreign Application Priority Data

Dec. 24, 2013 (KR) ........................ 10-2013-0162599

(51) Int. Cl.
*G06F 11/10* (2006.01)
*H03M 13/11* (2006.01)
*H03M 13/29* (2006.01)
*H03M 13/37* (2006.01)
*H03M 13/41* (2006.01)
(Continued)

(52) U.S. Cl.
CPC ....... *G06F 11/1048* (2013.01); *G06F 11/1012* (2013.01); *G06F 11/1068* (2013.01); *G11C 29/52* (2013.01); *H03M 13/1105* (2013.01); *H03M 13/1111* (2013.01); *H03M 13/2927* (2013.01); *H03M 13/2957* (2013.01); *H03M 13/2975* (2013.01); *H03M 13/3707* (2013.01); *H03M 13/3738* (2013.01); *H03M 13/3746* (2013.01); *H03M 13/3927* (2013.01);
(Continued)

(58) Field of Classification Search
CPC .............. G06F 11/1012; G06F 11/1068; G06F 11/1048; H03M 13/1108; H03M 13/3707; H03M 13/1111; H03M 13/2957; H03M 13/3746; H03M 13/41; H03M 13/45; H03M 13/1105; H03M 13/2927; H03M 13/2975; H03M 13/3738; H03M 13/3927; H03M 13/458; H03M 13/6513; G11C 29/52
USPC ................ 714/E11.032, 752, 755, 780, 763, 714/782,714/758, 773, 786, 799, 800
See application file for complete search history.

(56) References Cited

U.S. PATENT DOCUMENTS 6,339,546 B1    1/2002    Katayama et al.
8,032,810 B2   10/2011   Ishikawa et al.
(Continued)

FOREIGN PATENT DOCUMENTS

JP    2008-090778 A    4/2008
JP    2009-230475 A   10/2009
JP    2011-203771 A   10/2011

*Primary Examiner* — John J Tabone, Jr.
(74) *Attorney, Agent, or Firm* — Harness, Dickey & Pierce, P.L.C.

(57) ABSTRACT

A method of operating a memory controller includes; receiving hard decision data and first soft decision data from a non-volatile memory device, performing a first ECC decoding operation using the hard decision data and the first soft decision data: and then determining a second soft decision read voltage or reclaim operation of the non-volatile memory device based on the number of iteration operation of the first ECC (error correction code).

20 Claims, 17 Drawing Sheets

(51) Int. Cl.
  *H03M 13/45* (2006.01)
  *H03M 13/00* (2006.01)
  *G11C 29/52* (2006.01)
  *H03M 13/39* (2006.01)

(52) U.S. Cl.
  CPC ........... *H03M 13/41* (2013.01); *H03M 13/45* (2013.01); *H03M 13/458* (2013.01); *H03M 13/6513* (2013.01)

(56) References Cited

U.S. PATENT DOCUMENTS

| | | | |
|---|---|---|---|
| 8,078,923 B2 | 12/2011 | Nagadomi et al. | |
| 8,422,303 B2 | 4/2013 | Franca-Neto et al. | |
| 8,621,318 B1* | 12/2013 | Micheloni | G06F 11/1012 714/755 |
| 8,687,310 B1* | 4/2014 | Zhang | G11B 20/10268 360/39 |
| 8,743,493 B1* | 6/2014 | Chang | G11B 20/10268 360/39 |
| 8,984,376 B1* | 3/2015 | Norrie | H03M 13/1142 714/772 |
| 9,213,599 B2* | 12/2015 | Wu | G06F 11/1068 |
| 9,213,600 B2* | 12/2015 | Cohen | G06F 11/1068 |
| 9,270,296 B1* | 2/2016 | Nemati Anaraki | H03M 13/1105 |
| 2010/0217919 A1 | 8/2010 | Sukegawa et al. | |
| 2010/0235713 A1 | 9/2010 | Lee et al. | |
| 2011/0066899 A1 | 3/2011 | Kang et al. | |
| 2012/0198314 A1* | 8/2012 | Yang | G06F 11/1012 714/782 |
| 2012/0240007 A1* | 9/2012 | Barndt | H03M 13/1108 714/758 |
| 2012/0297273 A1* | 11/2012 | Sakaue | G06F 11/1048 714/773 |
| 2013/0007561 A1* | 1/2013 | Motwani | H03M 13/1102 714/758 |
| 2013/0031443 A1 | 1/2013 | Oh et al. | |
| 2013/0117640 A1* | 5/2013 | Tai | G06F 11/1048 714/780 |
| 2013/0132804 A1* | 5/2013 | Frayer | G06F 11/1012 714/780 |
| 2013/0139035 A1* | 5/2013 | Zhong | G11C 11/5642 714/773 |
| 2013/0145229 A1* | 6/2013 | Frayer | G06F 11/1012 714/755 |
| 2013/0145231 A1* | 6/2013 | Frayer | G06F 11/1012 714/763 |
| 2013/0179754 A1 | 7/2013 | Cherubini et al. | |
| 2014/0068379 A1* | 3/2014 | Sakaue | G06F 11/10 714/764 |
| 2014/0089767 A1* | 3/2014 | Chang | H03M 13/1108 714/780 |
| 2014/0143637 A1* | 5/2014 | Cohen | H03M 13/1108 714/773 |
| 2014/0149825 A1* | 5/2014 | Motwani | H03M 13/3723 714/764 |
| 2014/0164881 A1* | 6/2014 | Chen | G11C 16/00 714/773 |
| 2014/0169102 A1* | 6/2014 | Sun | G11C 16/26 365/185.24 |
| 2014/0229792 A1* | 8/2014 | Varnica | H03M 13/1108 714/759 |
| 2014/0258809 A1* | 9/2014 | Nguyen | H03M 13/1111 714/763 |
| 2014/0281788 A1* | 9/2014 | Nguyen | H03M 13/1108 714/752 |
| 2014/0289584 A1* | 9/2014 | Chilappagari | G06F 11/1068 714/755 |
| 2014/0325237 A1* | 10/2014 | Van Der Leest | G06F 21/72 713/189 |
| 2014/0344647 A1* | 11/2014 | Chilappagari | H03M 13/1108 714/773 |
| 2014/0351668 A1* | 11/2014 | Zhang | G06F 11/1068 714/758 |
| 2015/0026536 A1* | 1/2015 | Hubris | G06F 11/1048 714/758 |
| 2015/0082126 A1* | 3/2015 | Vernon | H03M 13/1108 714/774 |
| 2015/0092290 A1* | 4/2015 | Liu | G11B 20/1833 360/47 |
| 2015/0149855 A1* | 5/2015 | Alhussien | G06F 11/1012 714/758 |
| 2015/0149871 A1* | 5/2015 | Chen | G06F 11/1068 714/773 |
| 2015/0278015 A1* | 10/2015 | Haratsch | G06F 11/1012 714/764 |

* cited by examiner

FIG. 7

| SE\WE | 0 | 5 | 10 | 15 | 20 | 25 | 30 | 35 | 40 | 45 | 50 | 55 | 60 | 65 | 70 | 75 | 80 |
|---|---|---|---|---|---|---|---|---|---|---|---|---|---|---|---|---|---|
| 0 | ITRC | ITRC | ... | ... | ... | ... | ... | ... | ... | ... | ... | ... | ... | ... | ... | ITRC | ITRC |
| 5 | ITRC | ITRC | ... | ... | ... | ... | ... | ... | ... | ... | ... | ... | ... | ... | ... | ITRC | ITRC |
| 10 | . | . | ... | ... | ... | ... | ... | ... | ... | ... | ... | ... | ... | ... | ... | ... | ... |
| 15 | . | . | ... | ... | ... | ... | ... | ... | ... | ... | ... | ... | ... | ... | ... | ... | ... |
| 20 | . | . | ... | ... | ... | ... | ... | ... | ... | ... | ... | ... | ... | ... | ... | ... | ... |
| 25 | . | . | ... | ... | ... | ... | ... | ... | ... | ... | ... | ... | ... | ... | ... | ... | ... |
| 30 | . | . | ... | ... | ... | ... | ... | ... | ... | ... | ... | ... | ... | ... | ... | ... | ... |
| 35 | . | . | ... | ... | ... | ... | ... | ... | ... | ... | ... | ... | ... | ... | ... | ... | ... |
| 40 | . | . | ... | ... | ... | ... | ... | ... | ... | ... | ... | ... | ... | ... | ... | ... | ... |
| 45 | . | . | ... | ... | ... | ... | ... | ... | ... | ... | ... | ... | ... | ... | ... | ... | ... |
| 50 | . | . | ... | ... | ... | ... | ... | ... | ... | ... | ... | ... | ... | ... | ... | ... | ... |
| 55 | . | . | ... | ... | ... | ... | ... | ... | ... | ... | ... | ... | ... | ... | ... | ... | ... |
| 60 | . | . | ... | ... | ... | ... | ... | ... | ... | ... | ... | ... | ... | ... | ... | ... | ... |
| 65 | . | . | ... | ... | ... | ... | ... | ... | ... | ... | ... | ... | ... | ... | ... | ... | ... |
| 70 | . | . | ... | ... | ... | ... | ... | ... | ... | ... | ... | ... | ... | ... | ... | ... | ... |
| 75 | ITRC | ITRC | ... | ... | ... | ... | ... | ... | ... | ... | ... | ... | ... | ... | ... | ITRC | ITRC |
| 80 | ITRC | ITRC | ... | ... | ... | ... | ... | ... | ... | ... | ... | ... | ... | ... | ... | ITRC | ITRC |

# MEMORY CONTROLLER OPERATING METHOD AND MEMORY CONTROLLER

This application claims priority under 35 U.S.C. §119 to Korean Patent Application No. 10-2013-0162599 filed on Dec. 24, 2013, the entire contents of which are hereby incorporated by reference.

BACKGROUND

At least some example embodiments of the inventive concepts relate generally to methods of operating a memory controller and memory systems including a memory controller.

Memory devices including non-volatile memory devices operatively provide memory cells that may be used during the operation of a memory system and/or a constituent host device to store data. Available (i.e., functionally useable) memory space is always an important consideration as it usually constitutes a scarce system resource. Thus, steps must be taken to preserve not only the size of available memory space but also integrity of available memory space in relation to data operations.

Thus, an important balance must be struck by memory system designers between hazarding the integrity of stored data, and to quickly discarding (i.e., designating as "bad" weak memory cells or portions of memory space including weak memory cells.

SUMMARY

At least some example embodiments of the inventive concepts provide a memory controller operating method, as well as memory systems including a memory controller, that effectively enlarges the useful data storage space provided by one or more non-volatile memory device(s).

According to at least some example embodiments of the inventive concepts a method of operating a memory controller includes receiving hard decision data and first soft decision data from a non-volatile memory device; performing a plurality of iterations of a first error correction code (ECC) decoding operation using the hard decision data and the first soft decision data; and determining a second soft decision read voltage or determining to perform a reclaim operation of the non-volatile memory device based on a number of iterations, the number of iterations indicating how many iterations of the first ECC decoding operation are included in the plurality of iterations.

According to at least some example embodiments of the inventive concepts, there is provided a memory controller comprising; an ECC decoder configured to receive a hard decision data and a first soft decision data and perform a first ECC decoding operation; and a soft decision parameter management unit configured to change an offset value of a second soft decision read voltage when the first ECC decoding is failed and the number of iteration operation of the first soft decision data decoding is bigger than a reference value. The ROM (read only memory) configured to store a look up table indicating a correlation between the number of iteration and a ratio of strong error bits among the first soft decision data. The soft decision parameter management unit is configured to refer to look up table, check the ratio of strong error bits, and determine the offset value of the second soft decision read voltage. The offset is configured to determine log likelihood ratio (LLR) of the ECC decoder. According to at least some example embodiments of the inventive concepts, a method of operating a memory controller includes performing a first soft decision read operation; receiving hard decision data and first soft decision data from a non-volatile memory device, the first soft decision data being received as a result of the first soft decision read operation; performing a plurality of iterations of a first error correction code (ECC) decoding operation using the hard decision data and the first soft decision data; and determining, when the first ECC decoding operation fails, an offset of a second soft decision read operation subsequent to performing the first soft decision read operation, the determining being based on a number of iterations, the number of iterations indicating how many iterations of the first ECC decoding operation are included in the plurality of iterations.

A method of operating a memory controller, the method including performing a hard decision reading operation by reading hard decision data from a nonvolatile memory device; performing a first soft decision reading operation by reading first soft decision data from a nonvolatile memory device using a first soft decision reading voltage; performing a first number of iterations of a first error correction code (ECC) decoding operation using the hard decision data and first soft decision data; determining, at the memory controller, a second soft decision reading voltage based on the first number of iterations; and performing a second soft decision reading operation by reading second soft decision data from the nonvolatile memory device using the determined second soft decision reading voltage.

Determining, at the memory controller, a second soft decision reading voltage based on the first number of iterations may include accessing a look up table (LUT) that indicates relationships between a plurality of numbers of iterations of the first ECC code decoding operation and corresponding ones of a plurality of ratio values, respectively; determining, at the memory controller, a ratio value from among the plurality of ratio values that corresponds to the first number of iterations according to the LUT; and determining the second soft decision reading voltage based on the ratio value that corresponds to the first number of iterations.

The ratio value may be a ratio of a number of strong error bits to a total number of error bits in the first soft decision data, the strong error bits being bits associated with threshold values of memory cells of the nonvolatile memory device that result in read errors when read using a hard decision reading voltage and when read using the first soft decision reading voltage.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

FIG. 7 shows a look up table indicating a correlation between the number of iterations of an ECC decoding operation and a ratio of strong error bits.

DETAILED DESCRIPTION OF EMBODIMENTS

Figure 1:
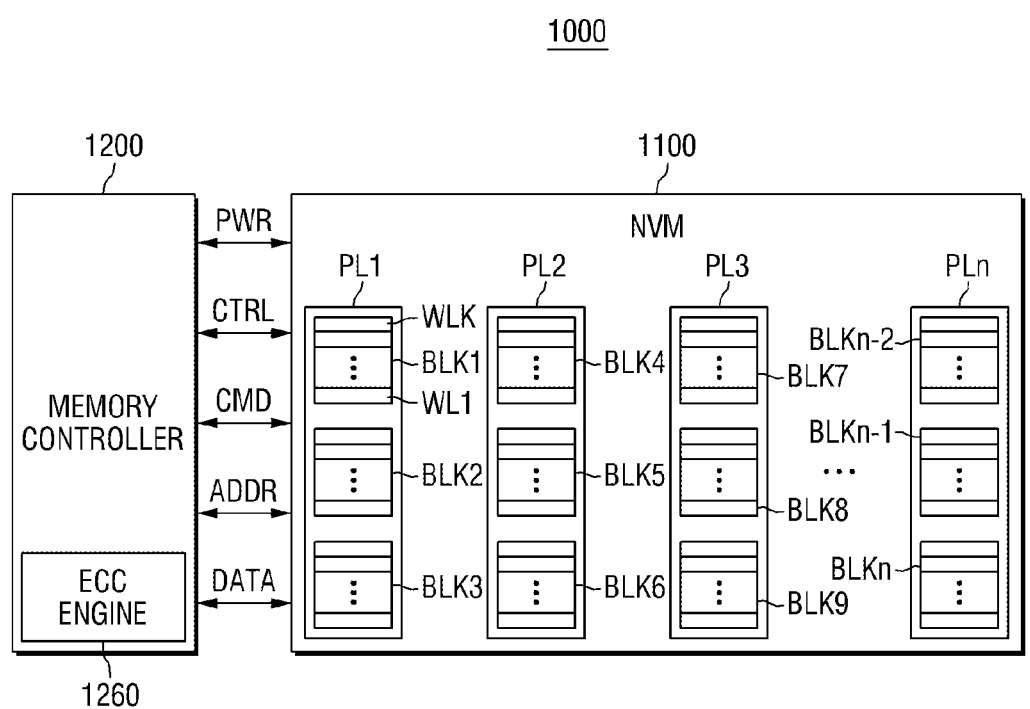
FIG. 1 is a block diagram illustrating a non-volatile memory system 1000 according to at least some example embodiments of the inventive concepts.

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram illustrating a non-volatile memory system 1000 according to at least some example embodiments of the inventive concepts.

Referring to FIG. 1, a non-volatile memory system 1000 may include a non-volatile memory device 1100 and a memory controller 1200. The non-volatile memory system 1000 may include non-volatile memory-based data storage mediums such as one or more of a memory card, a USB memory, a Solid State Drive (SSD), and the like.

The memory controller 1200 generally controls the non-volatile memory device. Thus, the non-volatile memory device performs a read, a program, and an erase operation under the control of memory controller. For this, the non-volatile memory device 1100 may receive a command CMD, an address ADDR, and data via input/output lines. The non-volatile memory device 1100 may receive a power PWR via a power line and a control signal CTRL via a control line. The control signal CTRL may include a command latch enable signal CLE, an address latch enable signal ALE, a chip enable signal nCE, a write enable signal nWE, a read enable signal nRE, but at least some example embodiments of the inventive concepts are not limited thereto.

The memory controller 1200 includes an ECC engine 1260. The ECC engine 1260 may perform error correction by iterative code, such as a low density parity check (LDPC) code or a turbo code, for example, although at least some example embodiments of the inventive concepts are not limited thereto. The ECC engine 1260 that uses the iterative code is configured to perform the iterative operation. And, the ECC engine 1260 may increase capability of error bit correction by using both hard decision read data and soft decision data. Thus, the ECC engine 1260 which uses LDPC code may have outstanding capability of error bit correction by using log likelihood ratio which originates from soft decision information.

The ECC engine 1260 may include any type of circuit, system and device capable of performing error correction.

As described above, when the number of error bits is greater than the correctable error bit limit value of the ECC engine 1260, an error correction fail may be generated.

A type of memory included in the non-volatile memory device 1110 may be one or more of a flash memory, an electrically erasable programmable read only memory (EEPROM), a ferroelectrics random access memory (FRAM), a phase change random access memory (PRAM), resistive random access memory (ReRAM), and a magneto resistive random access memory (MRAM). Although a NAND flash memory device 1100 is illustrated as an example in FIG. 1, at least some example embodiments of the inventive concepts are not limited thereto. Referring to FIG. 1, the non-volatile memory device 1110 may serve as a storage unit configured to store data provided from the memory controller 1200.

The non-volatile memory device 1110 may include a plurality of cell arrays configured to store data. Each of the cell arrays may include a plurality of planes PL1 through PLn (here, n denotes a natural number). Each of the planes PL1 through PLn includes a plurality of blocks BLK1 through BLKm (here, m denotes a natural number). Each of the blocks BLK1 through BLKm includes a plurality of word lines such as word line 1, WL1 through word line K, WLk (here, k denotes a natural number). Each of the blocks BLK1 through BLKm may be a unit for executing an erase command, that is, a unit on which an erase operation is simultaneously performed. Each of the word lines may be a unit for executing a program and a read command, that is, a unit on which a program and a read operation are simultaneously performed. A plurality of blocks may include three dimensional structure that memory cells are stacked on a substrate.

Non-volatile memory device 1100 may cause degradation of reliability based on data pattern. The causes of degradation may be charge loss, back pattern dependency, and coupling and happen based on data pattern. The phenomena of charge loss, back pattern dependency, and coupling may be improved by controlling programmed data patterns which decrease reliability. MLC (multi level cell) non-volatile memory device 1100 includes a plurality of programmed state.

According to at least some example embodiments of the present inventive concepts, ECC engine 1260 is configured to correct error bits of data from non-volatile memory device 1100 and count the number of iterations of an ECC decoding operation. The memory controller 1200 may determine a soft decision read voltage based on the number of iterative operation of ECC decoding. And the memory controller 1200 is configured to determine to perform a read reclaim operation based on the number of iterative operation of ECC decoding.

Figure 2:
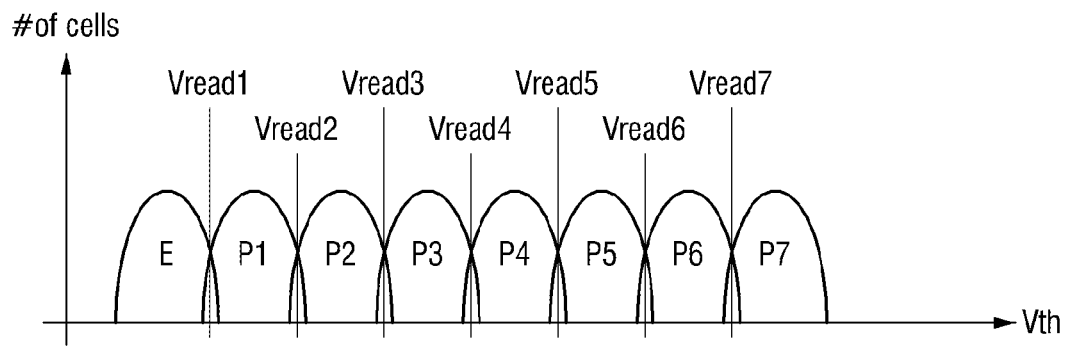
FIG. 2 shows exemplary program and erase threshold voltage distributions of 3-bit multi-level cell (MLC) flash memory after a charge loss happens.

FIG. 2 shows exemplary program and erase threshold voltage distributions of 3-bit MLC (multi-level cell) flash memory after a charge loss happens.

In the MLC flash memory device, a memory cell may store multi-bit data (i.e., at least 2-bit data) per cell. For example, if k bits are to be programmed in a memory cell, one of $2^k$ threshold voltages must be present in the memory cell. Due to the minute difference between the electrical characteristics of memory cells, the threshold voltages of memory cells programmed with the same data may generate a desired (or, in the alternative, a predetermined) range of threshold voltage distribution. Threshold voltage distributions may correspond respectively to $2^k$ data values that may be generated by k-bit data.

Referring to FIG. 2, 3 bits MLC flash memory device may form one threshold distribution of erase state (E) and seven numbers of threshold distributions of program state (P1, P2, . . . P6, P7).

Through the passage of time, the adjacent threshold voltage distributions may start to overlap each other after programming because of a charge loss, a program disturbance, an erase disturbance, and a back pattern dependency.

The charge loss means electrons trapped by floating gate layer or tunnel oxide layer, are emitted. The charge loss results in the shifting of the threshold distribution towards the left in the drawings. The degradation of tunnel oxide layer that results from repeated program and erase cycle may also increase the charge loss phenomena.

The program disturbance, the erase disturbance, and the back pattern dependency results in the shifting of the threshold distribution towards the right. The program disturbance, the erase disturbance, and the back pattern dependency increase the threshold voltages.

Referring to FIG. 2, as the erased state, and the programmed state (P1, P2 . . . P7) overlap, read data may include a number of error bits (e.g., several error bits or several tens of error bits). For example, assuming that the read voltage Vread3 is used for read operation, the 'on' state indicates P2 state data and the 'off' state indicates P3 state data. However, in the case of the overlapped ratio, even the P3 state can correspond to the 'on' state and even the P2 state can correspond to the 'off' state. As the adjacent threshold voltage distributions overlap each other, read data may include a number of error bits (e.g., several error bits or several tens of error bits).

Figure 3:
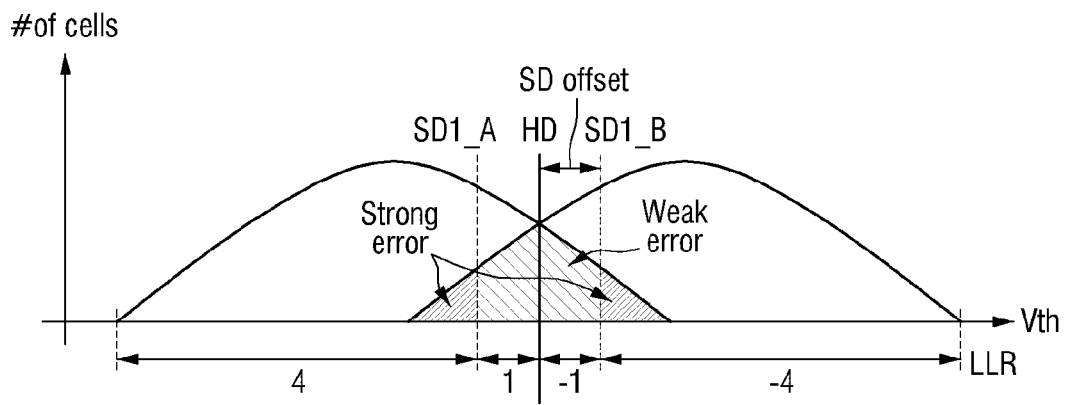
FIG. 3 illustrates a plurality of read voltages and strong error bits and weak error bits which respectively correspond to each read voltage in terms of the first soft decision read operation.

FIG. 3 illustrates a plurality of read voltages and strong error bits and weak error bits which respectively correspond to each read voltage in terms of the first soft decision read operation.

FIG. 3 shows two adjacent overlapped threshold voltage distributions. Referring to FIG. 3, 'X' axis indicates threshold voltage and 'Y' axis indicates the number of cells having a particular threshold voltage.

As described above, ECC engine 1260 receives hard decision read data from non-volatile memory device 1100 and is configured to correct error bits by using iterative code, for example, LDPC code.

The hard decision read operation may read programmed data. Thus, the hard decision read operation may read data '1' or '0' based on a state of a memory cell (i.e., 'on' or 'off') by providing hard the memory cell with hard decision read voltage.

Referring to FIG. 3, hard decision read voltage is HD. When HD is provided, the hard decision data is 1 if memory cell's state is on and the hard decision data is 0 if memory cell's state is off.

Referring to FIG. 3, the soft decision read operation may include two additional read operations that are performed sequentially on the basis of the first soft decision read voltages, SD1_A and SD1_B, although the hard decision read operation uses HD read voltage. The voltage difference value between hard decision voltage, HD and the first soft decision read voltages, SD1_A or SD1_B is soft decision offset SD offset as described in FIG. 3. The soft decision data operation may generate reliability information corresponding to the hard decision data.

When the threshold voltage of memory cells is lower than SD1_A, there may be strong error bits. When the threshold voltage of memory cells is higher than SD1_B, there may be strong error bits. And when the threshold voltage of memory cells corresponds to between SD1_A and SD1_B, there may be weak error bits. ECC engine 1260 using iterative code such as LDPC code may decrease the capability of error correction when the ratio of strong error bits among total error bits is high. As used herein the term 'ratio of strong error bits' refers to the ratio of the number of strong error bits to the total number of error bits.

Moreover, referring to FIG. 3, 'X' axis indicates log likelihood ratio (LLR). The LLR is the specific value used during ECC decoding and generates reliability information corresponding to the hard decision data. Thus, LLR indicates reliability information whether hard decision data is 1 or 0 and if the hard decision data is 0, LLR generates reliability information of data 0.

Referring to FIG. 3, it is assumed that the absolute value of LLR corresponding to between hard decision read voltage HD and the first soft decision read voltage is 1. And it is assumed that the absolute value of LLR corresponding to between the first soft decision read voltage and the end of threshold voltage distribution of memory cells is 4. When the absolute value of LLR is bigger, the reliability of hard decision is increased.

Figure 4:
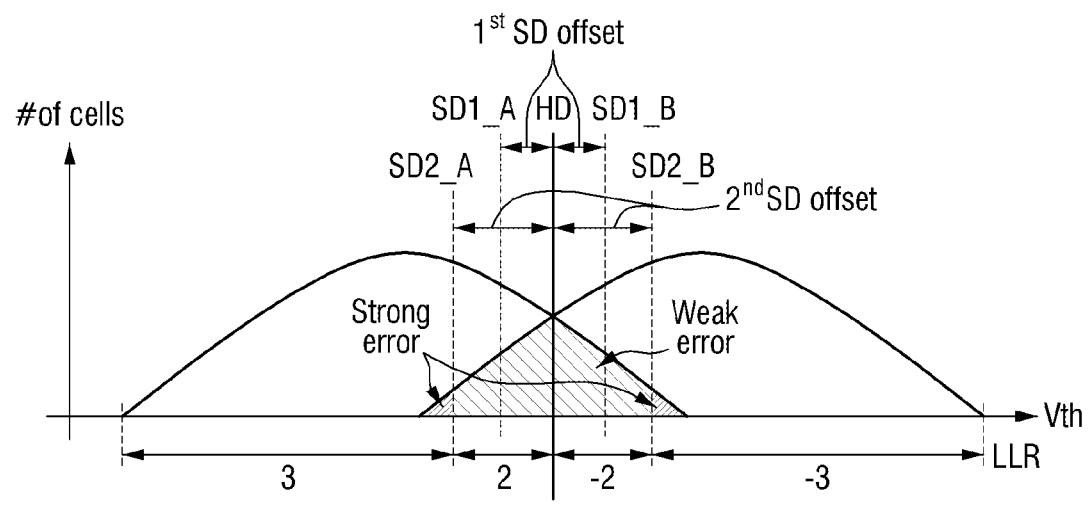
FIG. 4 illustrates a plurality of read voltages of the second soft decision read operation and strong error bits and weak error bits which respectively correspond to each read voltage in terms of the second soft decision read operation.

FIG. 4 illustrates a plurality of read voltages of the second soft decision read operation and strong error bits and weak error bits which respectively correspond to each read voltage in terms of the second soft decision read operation.

Referring to FIG. 4, the 'X' (i.e., horizontal) axis indicates threshold voltage and LLR. The 'Y' (i.e., vertical) axis indicates the number of memory cells having a particular threshold voltage. Referring to FIG. 3 and FIG. 4, ECC engine 1260 performs the first soft decision read operation and fails the first ECC decoding operation. Then, ECC engine 1260 sequentially performs the second soft decision read operation and performs error correction using the second soft decision data.

Referring to FIG. 4, the second soft decision read voltages include SD2_A and SD2_B. The voltage difference value between hard decision voltage HD and the second soft decision read voltages SD2_A or SD2_B is the second soft decision offset $2^{nd}$ SD offset. The voltage difference value between hard decision voltage HD and the first soft decision read voltages SD1_A or SD1_B is the first soft decision offset SD offset. The memory controller 1200 is configured to determine the second soft decision offset based on the number of iterations of the first ECC decoding operation when the first ECC decoding operation fails.

Referring to FIG. 3 and FIG. 4, the second soft decision offset is bigger than the first soft decision offset. The ratio of strong error bits to other bits may become smaller by setting a larger second soft decision offset. The memory controller 1200 may adjust the ratio of strong error bits by changing soft decision offset and improve capability of error correction. The absolute value of LLR corresponding to between hard decision read voltage HD and the second soft decision read voltage is 2. And, the absolute value of LLR corresponding to between hard decision read voltage HD and the first soft decision read voltage is 1. Thus, the absolute value of LLR corresponding to between hard decision read voltage HD and the second soft decision read voltage is bigger than that of hard decision read voltage HD and the first soft decision read voltage. Thus, reliability of the second soft decision data is improved.

Figure 5:
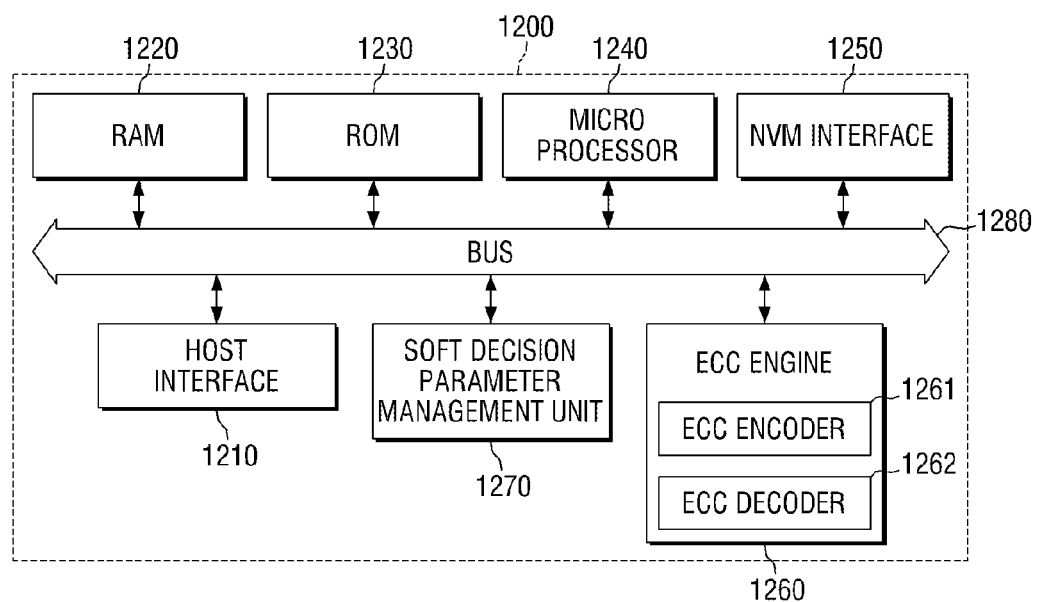
FIG. 5 is a detailed block diagram of memory controller 1200 of FIG. 1.

FIG. 5 is a detailed block diagram of memory controller 1200 of FIG. 1. The controller 1200 may include a microprocessor 1240, a read-only memory (ROM) 1230, a random access memory (RAM) 1220, a memory interface 1250, an ECC engine 1260, soft decision parameter management unit 1270 and a bus 1280. The elements 1210 through 1270 of the controller 1200 may be electrically connected to each other through the bus 1280.

The host interface 1210 may perform an interface between the memory system 1000 including the memory controller 1200 and a host. The host interface 1210 may provide a logical address, a command latch enable (CLE) signal, an address latch enable (ALE) signal, a ready and busy (R/B) signal, a chip enable/disable (CE) signal from the host to the memory controller. Also, the host interface 1210 may communicate with the host according to a predetermined protocol. For example, the predetermined protocol may be a universal serial bus (USB), a small computer system interface (SCSI), a PCI express, an ATA, a parallel ATA (PATA), a serial ATA (SATA), and a serial attached SCSI (SAS), but at least some example embodiments of the inventive concepts are not limited thereto.

The RAM 1220 is a memory that serves as a buffer, and may store a command input through the host interface, replacement block request information when a bad block occurs in the non-volatile memory device 1110, and various types of variables. The RAM 1220 may store data input to the non-volatile memory device 1110 or output from the non-volatile memory device 1110. The RAM 1220 may store data input to and output from the non-volatile memory device 1110, various types of parameters, and variables.

The ROM 1230 may store a driving firmware code of the memory system, but at least some example embodiments of the inventive concepts are not limited thereto. A firmware code may also be stored in the non-volatile memory device 1110, for example, a flash memory device 1100 in addition to the ROM 1230. Accordingly, control or intervention of the microprocessor 1240 may include interference of firmware that is software driven by the microprocessor 1240 as well as direct control of the microprocessor 1240 in terms of hardware.

The microprocessor 1240 may be configured using a circuit, a logic, a code, or a combination thereof, and overall controls an operation of the memory system 1000 including the memory controller. When power is applied to the memory system 1000, the microprocessor 1240 may control the overall operation of the memory system 1000 by driving, on the RAM 1220, firmware for an operation of the memory system 1000 stored in the ROM 1230. Also, the microprocessor 1240 may interpret a command applied through the host interface 1210 and may control the overall operation of the non-volatile memory device 1110 based on the interpretation result. Also, the microprocessor 1240 may map a logical address provided from the host to a physical address corresponding to a non-volatile memory using an address mapping table.

The memory interface 1250 may exchange a signal between the memory controller 1200 and the non-volatile memory device 1110. A command requested by the microprocessor 1240 may be provided to the non-volatile memory device 1110 through the memory interface 1250. Also, data may be transmitted from the memory controller 1200 to the non-volatile memory device 1110. Also, data output from the non-volatile memory device 1110 is provided to the memory controller 1200 through the memory interface 1250.

The ECC engine 1260 may be configured to perform error bit correction and include the ECC decoder 1262 and ECC encoder 1261. The ECC decoder 1262 and the ECC encoder 1261 may perform error bit correction.

The ECC encoder 1261 may be configured to generate data added with parity bits by performing error correction encoding on data provided to the non-volatile memory device 1110. The parity bits may be stored in the non-volatile memory device 1110.

The ECC decoder 1262 is configured to perform error correction decoding on output data, determine whether the error correction decoding is successful based on the result of the error correction decoding, and outputs an instruction signal based on the decoding result. Read data may be transmitted to the ECC decoder 1262, and the ECC decoder 1262 may correct error bits of the data using the parity bits. When the number of error bits exceeds a limit numbers of error bits that can be corrected, the ECC decoder 1262 cannot correct the error bits, resulting in an error correction failure.

As described above, various codes may be used as the code used by the ECC engine 1260. However, the ECC engine 1260 using an iterative code such as a low density parity check (LDPC) code will be described below by way of example, for purposes of illustration. According to at least some example embodiments of the present inventive concepts, the ECC engine 1260 has a parity check matrix H satisfying the following Equation (1), in which S is a syndrome, H is a parity check matrix, and $c^T$ is a transposed matrix of a codeword c:

$$S = Hc^T = 0 \quad \text{Equation (1)}$$

The ECC decoder 1262 performs error bit correction of the data from the non-volatile memory device 1100 using the parity check matrix. The ECC decoder 1262 may receive hard decision data or soft decision data that is probability data added to the hard decision data from the non-volatile memory device 1100. When the ECC decoder 1262 fails in error bit correction of the hard decision data, the first soft decision data is used to perform error bit correction, that is called the first ECC decoding operation.

According to at least some example embodiments of the present inventive concepts, ECC decoder 1262 may be configured to perform an iterative operation by using parity check matrix. ECC decoder may count the number of operation iterations during the first ECC decoding.

A soft decision parameter management unit 1270 may be configured to determine the second soft decision read voltage based on the number of iterations of the first ECC decoding operation. In other words, the soft decision parameter management unit 1270 may be configured to determine the second soft decision offset based on the number of iterations of the first ECC decoding operation. If the number of iterations of the first ECC decoding operation is bigger than a reference value, the soft decision parameter management unit 1270 may determine that the second soft decision offset such that the second soft decision offset is bigger than the first soft decision offset. Moreover, the soft decision parameter management unit 1270 may be configured to determine the second soft decision offset based on a ratio of strong error bit by referring to a look up table which indicates a correlation between the number of operation iterations and a ratio of strong error bits. For example, even though the number of iterations of the first ECC decoding may be bigger than the reference value, the soft decision parameter management unit 1270 may not determine the second soft decision offset such that the second soft decision offset is bigger than the first soft decision offset if the ratio of strong error bits is small. The look up table may be stored in ROM 1230 or non-volatile memory device 1100. The look up table may be, for example, predetermined in that it may be set during a manufacturing process. But, the look up table may be updated on a real time basis. Changing the soft decision offset may alter LLR of the ECC decoder. Therefore, the soft decision offset may determine LLR of the ECC decoder.

Furthermore, when the ECC decoder succeeds the error correction during the first ECC decoding operation, the microprocessor 1240 may determine whether a read reclaim operation is performed or not based on the number of iterations of the first ECC decoding operation. When the number of operation iterations is bigger than a specific reference value, the microprocessor 1240 may let the controller 1200 perform read reclaim operation. As used here in the phrases 'number of operation iterations' and 'number of operation iterations of the first ECC decoding' refer to the number of iterations in a sequence of iteratively performed first ECC decoding operations.

Further, the microprocessor 1240 may check the ratio of strong error bits according to the number of operation iterations during the first ECC decoding. Then, the microprocessor 1240 may determine whether a read reclaim operation is performed or not based on the ratio of strong error bits. When a read reclaim operation is performed, the memory controller 1200 may provide non-volatile memory device 1100 with error corrected data, target address and read reclaim command.

Figure 6:
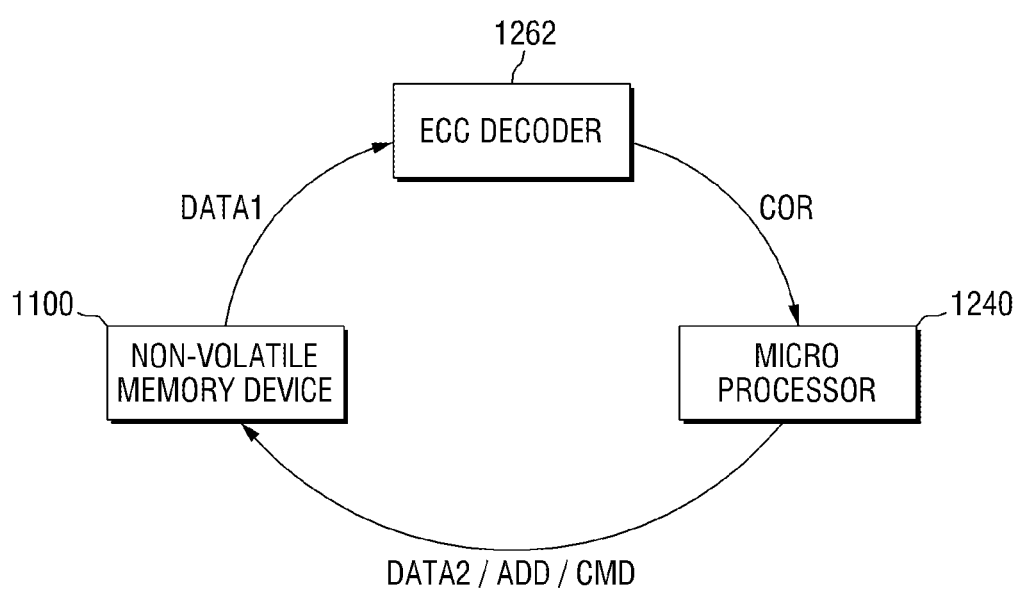
FIG. 6 is a block diagram of a memory system for explaining a read reclaim operation according to at least some example embodiments of the inventive concepts.

FIG. 6 is a block diagram of a memory system for explaining a read reclaim operation according to at least some example embodiments of the present inventive concepts.

Referring to FIG. 6, the memory system according to at least one example embodiment may include a non-volatile memory device 1100, a microprocessor 1240, and an error correction code (ECC) decoder 1262.

The microprocessor 1240 provides a first read command READ_CMD1 and an address ADDR to the non-volatile memory device 1100.

The non-volatile memory device 1100 provides the ECC decoder 1262 with first data DATA1. The ECC decoder 1262 receives the first data DATA1 and performs error correction using LDPC code.

The ECC decoder 1262 provides the microprocessor 1240 with a correction success signal COR indicating that error correction is successful.

The microprocessor 1240 may determine whether or not to cause a read reclaim operation to be performed based on the number of iterations of the ECC decoding operation. Further, the microprocessor 1240 may check the ratio of strong error bits according to the number of operation iterations during ECC decoding. Then, the microprocessor 1240 may determine whether read reclaim operation is performed or not based on the ratio of strong error bits.

The read reclaim operation may replace the first block, which is configured to store less reliable first data, with the second block. Thus, error corrected first data is stored in the second block as second data and the reliability of first data is improved.

When both the number of operation iterations and the ratio of strong error bits are bigger than each respective reference value, the microprocessor 1240 provides the non-volatile memory device 1100 with second data DATA2, target address(ADD), and read reclaim command(CMD).

In terms of read reclaim operation, the target address is different from the address corresponding to first data.

The microprocessor 1240 may refer to look up table when the microprocessor 1240 checks the ratio of strong error bits. As described above, the look up table indicates a correlation between the number of iteration operation of ECC decoding and a ratio of strong error bits among first soft decision data.

The look up table may be stored in ROM 1230 or non-volatile memory device 1100.

FIG. 7 shows a look up table indicating a correlation between the number of operation iterations of ECC decoding and a ratio of strong error bits.

Referring to FIG. 7, horizontal axis indicates the ratio % of strong error bits and vertical axis indicates the ratio % of weak error bits. A cross point of horizontal and vertical axis may be the number of operation iterations of ECC decoding (ITRC).

The look up table indicates correlation between the number of iteration operation of ECC decoding and a ratio of strong error bits. The ECC decoder provides the microprocessor 1240 or soft decision parameter management unit 1270 with the number of operation iterations of ECC decoding. The microprocessor 1240 or soft decision parameter management unit 1270 may check the ratio of strong error bits referring to the look up table.

Referring to FIG. 5 through FIG. 7, ECC decoder 1262 is configured to count the number of operation iterations of ECC decoding. ECC decoder 1262 provides the number of iterations of the ECC decoding operation to soft decision parameter unit 1270 or microprocessor 1240.

The soft decision parameter unit 1270 may check the ratio of strong error bits corresponding to the number of iteration operation based on the look up table and determine a second soft decision offset. Alternatively, instead of the soft decision parameter unit 1270, the microprocessor 1240 may determine whether a read reclaim operation is performed or not based on the ratio of strong error bits corresponding to the number of iteration operation referring to the look up table.

Figure 8:
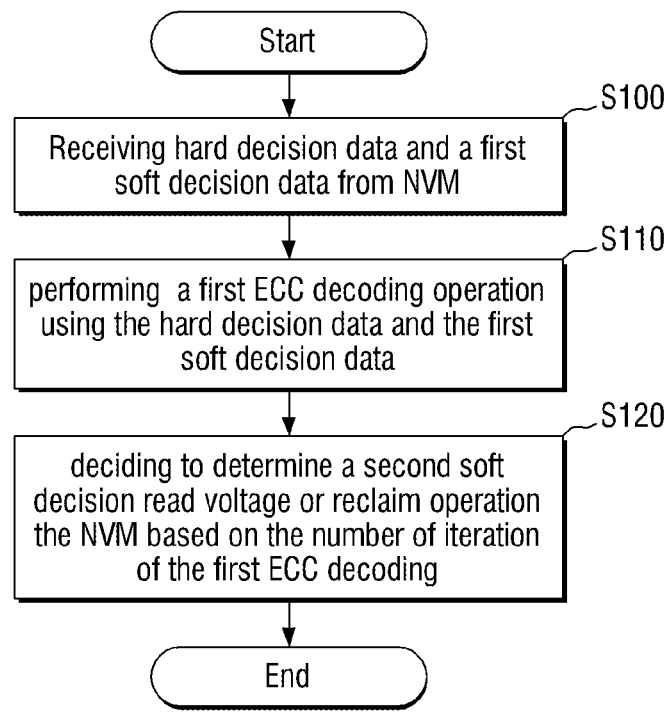
FIG. 8 is a flowchart illustrating a method of operating a memory controller according to at least some example embodiments of the inventive concepts.

FIG. 8 is a flowchart illustrating a method of operating a memory controller according to at least some example embodiments of the present inventive concepts.

The memory controller 1200 may receive hard decision data and first soft decision data S100. The memory controller 1200 may perform a first ECC decoding operation using both hard decision data and first soft decision data. (S110)

According to a result of first ECC decoding operation, the memory controller 1200 may be configured to determine the second soft decision read voltage or determine to perform a read reclaim operation on the non-volatile memory device 1100 based on the number of operation iterations of the first ECC decoding. (S120)

To be specific, when the first ECC decoding operation fails, the memory controller 1200 determines the second soft decision read voltage. The memory controller 1200 may determine the second soft decision offset based on the number of operation iterations of the first ECC decoding. The memory controller 1200 may refers to the look up table indicating a correlation between the number of operation iterations of ECC decoding and a ratio of strong error bits when the memory controller 1200 determines the second soft read voltage.

Moreover, although the first ECC decoding operation is succeeded, the memory controller 1200 may determine to perform the read reclaim operation if the ratio of strong error bits is higher than a reference value based on the look up table indicating a correlation between the number of operation iterations of ECC decoding and a ratio of strong error bits.

Figure 9:
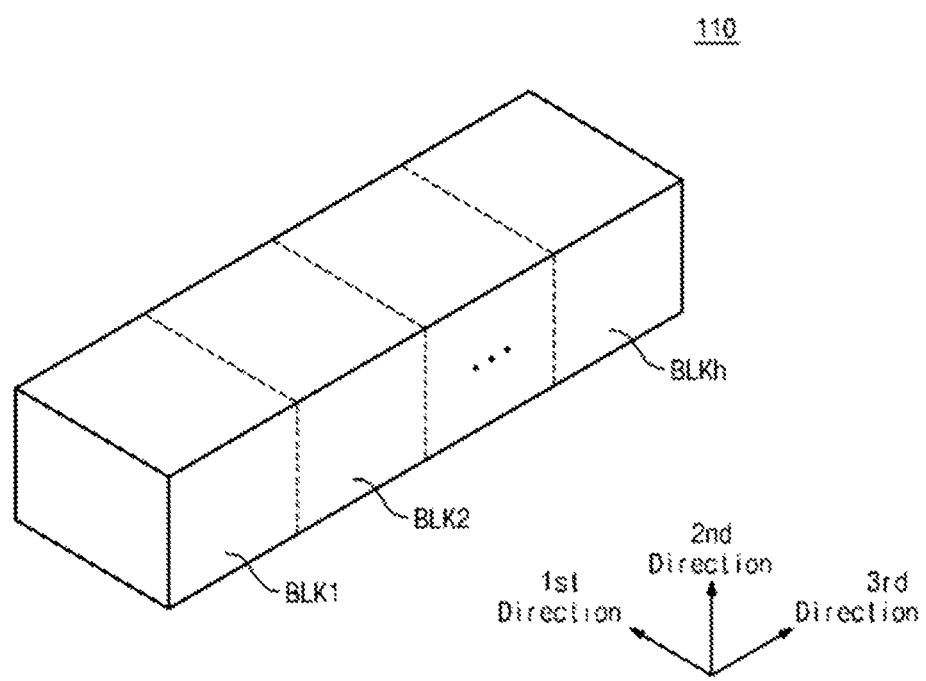
FIG. 9 is a conceptual diagram illustrating one possible arrangement for memory cells in the constituent memory cell array of the non-volatile memory device of FIG. 1 according to at least some example embodiments of the inventive concepts.

As shown in FIGS. 9 to 12, a non-volatile memory device 1100 according to example embodiments may have a three-dimensional structure. FIG. 9 is a diagram schematically illustrating a memory cell array of the non-volatile memory device 1100 in FIG. 1 according to at least some example embodiments of the present inventive concepts. Referring to FIG. 9, a memory cell array may include a plurality of memory blocks BLK1 through BLKh, each of which is formed to have a three-dimensional structure (or, a vertical structure). For example, each of the memory blocks BLK1 through BLKh may include structures extending along first to third directions.

Each of the memory blocks BLK1 through BLKh may include a plurality of NAND strings extending along the second direction. For example, a plurality of NAND strings NS may be provided along the first and third directions. Each NAND string NS may be connected to a bit line, at least one string selection line, at least one ground selection line, word lines, and a common source line. That is, each memory block may be connected to a plurality of bit lines, a plurality of string selection lines, a plurality of ground selection lines, a plurality of dummy word lines, and a plurality of common source lines. Each memory block will be more fully described with reference to FIG. 10 through FIG. 12.

Figure 10:
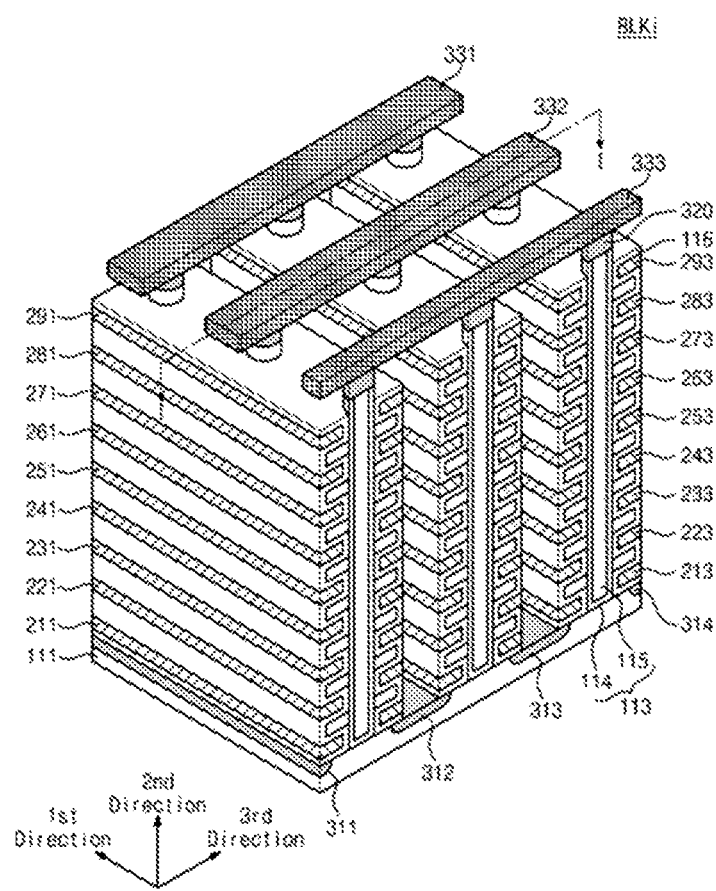
FIG. 10 is a perspective view further illustrating in one example a portion of the memory block 110 of FIG. 9.
Figure 11:
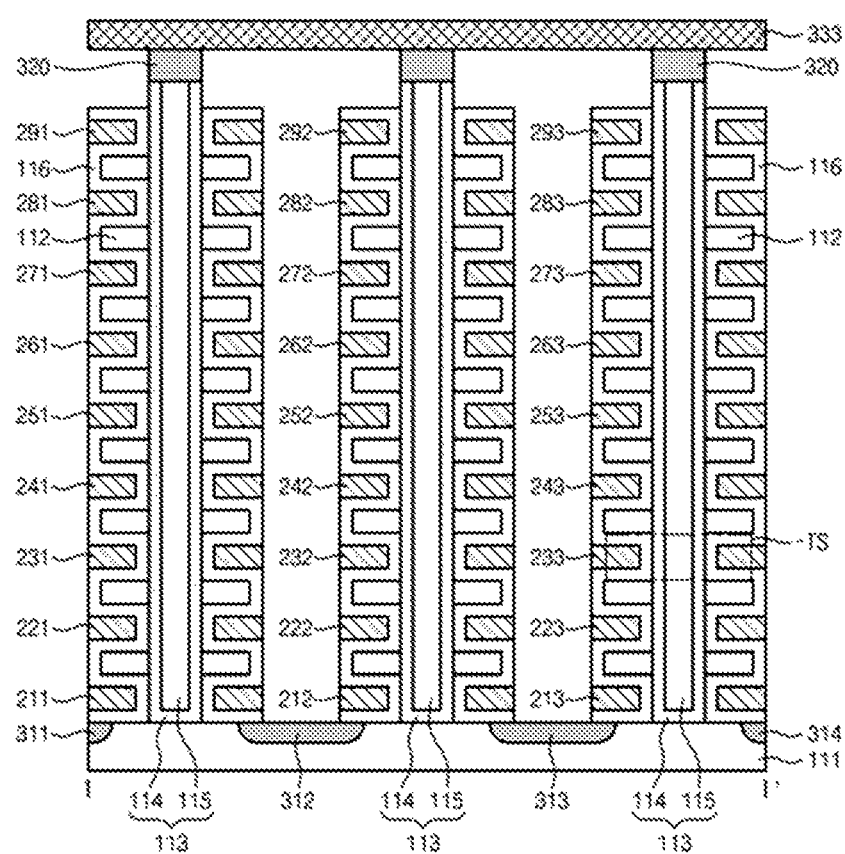
FIG. 11 is a cross-sectional view taken along a line I-I' of FIG. 10.

FIG. 10 is a perspective view of a part of a memory block in FIG. 9 according to at least some example embodiments of the present inventive concepts, and FIG. 11 is a cross-sectional view taken along a line I-I' of FIG. 10. Referring to FIGS. 10 and 11, a memory block BLKi may include structures that extend along first to third directions.

First, a substrate 111 may be provided. In example embodiments, the substrate 111 may include a silicon material doped with a first-type impurity. For example, the substrate 111 may be a silicon material doped with a p-type impurity or a p-well (or, a pocket p-well), and may further include an n-well surrounding the p-well. Below, it is assumed that the substrate 111 is p-type silicon. However, the substrate 111 is not limited thereto.

A plurality of doping regions 311 through 314 extending along the first direction may be provided at the substrate 111. For example, a plurality of doping regions 311 through 314 (hereinafter, referred to first through fourth doping regions) may be an n-type. Hereinafter, it is assumed that the first through fourth doping regions 311 through 314 are an n-type. However, the first through fourth doping regions 311 through 314 are not limited thereto.

On the substrate 111 between the first and second doping regions 311 and 312, a plurality of insulating materials 112 extending along the first direction may be sequentially provided along the second direction. For example, the plurality of insulating materials 112 and the substrate 111 may be spaced apart along the second direction. For example, the plurality of insulating materials 112 may be formed to be separated by a desired (or alternatively predetermined) distance along the second direction. In example embodiments, the insulating materials 112 may include an insulating material such as silicon oxide.

On the substrate 111 between the first and second doping regions 311 and 312, a plurality of pillars 113 may be provided which are sequentially disposed along the first direction and pass through the insulating materials 112 along the second direction. In example embodiments, the pillars 113 may contact with the substrate 111 through the insulating materials 112, respectively.

In example embodiments, each of the pillars 113 may be formed of a plurality of materials. For example, a surface layer 114 of each pillar 113 may include a first-type silicon material. For example, the surface layer 114 of each pillar 113 may include a silicon material doped with the same type as the substrate 111. Hereinafter, it is assumed that the surface layer 114 of each pillar 113 includes p-type silicon. However, the surface layer 114 of each pillar 113 is not limited thereto.

An inner layer 115 of each pillar 113 may be formed of an insulating material. For example, the inner layer 115 of each pillar 113 may include an insulating material such as silicon oxide, but at least some example embodiments of the present inventive concepts are not limited thereto.

Between the first and second doping regions 311 and 312, an insulating film 116 may be provided along exposed surfaces of the substrate 111, the insulating materials 112, and the pillars 113. For example, the thickness of the insulating film 116 may be less than half a distance between the insulating materials 112. That is, a region where a material other than the insulating materials 112 and the insulating film 116 is disposed may be provided between an insulating film 116 provided on a lower surface of a first insulating material among the insulating materials 112 and an insulating film 116 provided on an upper surface of a second insulating material and at the lower ratio of the first insulating material.

Between the first and second doping regions 311 and 312, conductive materials 211 through 291 may be provided on an exposed surface of the insulating film 116. For example, a conductive material 211 extending along the first direction may be provided between the substrate 111 and the insulating material 112 adjacent to the substrate 111. In detail, the conductive material 211 extending along the first direction may be provided between the substrate 111 and the insulating film 116 at a lower surface of the insulating material adjacent to the substrate 111.

A conductive material extending along the first direction may be provided between an insulating film 116 on an upper surface of a specific insulating material of the insulating materials 112 and an insulating film 116 on a lower surface of an insulating material disposed at a top of the specific insulating material.

A plurality of conductive materials 221 through 281 extending along the first direction may be provided among the insulating materials 112. Further, a conductive material 291 extending along the first direction may be provided on the insulating materials 112. In example embodiments, the conductive materials 211 through 291 may be a metal material. For example, the conductive materials 211 through 291 may be a conductive material such as polysilicon.

The same structure as that on the first and second doping regions 311 and 312 may be provided between the second and third doping regions 312 and 313. Between the second and third doping regions 312 and 313, there may be provided the insulating materials 112 extending along the first direction, the pillars 113 sequentially disposed in the first direction and passing through the insulating materials 112 along the second direction, the insulating film 116 provided on exposed surfaces of the pillars 113 and the insulating materials 112, and the conductive materials 212 through 292 extending along the first direction.

The same structure as that on the first and second doping regions 311 and 312 may be provided between the third and fourth doping regions 313 and 314. Between the third and fourth doping regions 313 and 314, there may be provided the insulating materials 112 extending along the first direction, the pillars 113 sequentially disposed in the first direction and passing through the insulating materials 112 in the third direction, the insulating film 116 provided on the exposed surfaces of the insulating materials 112 and the pillars 113, and the first conductive materials 213 through 293 extending along the first direction.

Drains 320 may be provided on the pillars 113, respectively. In example embodiments, the drains 320 may include a second-type silicon material. For example, the drains 320 may be an n-type silicon material. Hereinafter, it is assumed that the drains 320 include an n-type silicon material. However, the drains 320 are not limited thereto. In example embodiments, a width of each drain 320 may be wider than that of a corresponding pillar 113. For example, each drain 320 may be provided on a corresponding pillar 113 to have a pad shape.

Conductive materials 331 through 333 extending along the third direction may be provided on the drains 320. The conductive materials 331 through 333 may be sequentially disposed along the first direction. The conductive materials 331 through 333 may be connected to the drains 320 of corresponding regions, respectively. In example embodiments, the drains 320 and the second conductive material 333 extending along the third direction may be connected through contact plugs. In example embodiments, the conductive materials 331 through 333 may be a metal material. For example, the conductive materials 331 through 333 may be a conductive material such as polysilicon.

In FIGS. 10 and 11, each pillar 113 may form a string together with an adjacent region of an insulating film 116 and an adjacent region among the conductive lines 211 through 291, 212 through 292, and 213 through 293 extending along the first direction. For example, each pillar 113 may form a NAND string NS together with an adjacent region of an insulating film 116 and an adjacent region among the conductive lines 211 through 291, 212 through 292, and 213 through 293 extending along the first direction. The NAND string NS may include a plurality of transistor structures TS.

A p-type silicon surface layer 114 of a pillar 113 may act as a body. The first sub-insulating film 117 may act as a tunneling insulating film. For example, the first sub-insulating film 117 adjacent to the pillar 113 may include a thermal oxide layer.

The second sub-insulating film 118 may act as a charge storage film. For example, the second sub-insulating film 118 may act as a charge trap layer. For example, the second sub-insulating film 118 may include a nitride layer or a metal oxide layer (e.g., an aluminum oxide layer, a hafnium oxide layer, or the like).

The third sub-insulating film 119 adjacent to a first conductive material 233 may act as a blocking insulating film. In example embodiments, the third sub-insulating film 119 adjacent to a conductive material 233 extending along a first direction may be a single layer or a multi-layer. The third sub-insulating film 119 may be a high dielectric layer (e.g., an aluminum oxide layer or a hafnium oxide layer) having a larger dielectric constant compared with the first and second sub-insulating films 117 and 118.

The conductive material 233 may serve as a gate (or a control gate). That is, the conductive material 233 serving as a gate (or a control gate), the third sub-insulating film 119 serving as the blocking insulating film, the second sub-insulating film 118 serving as the charge storage layer, the first sub-insulating film 117 serving as the tunneling insulation layer, and the p-type surface layer 114 serving as a body may form a transistor (or, a memory cell transistor structure). In example embodiments, the first through third sub-insulating films 117 through 119 may form oxide-nitride-oxide (ONO). Below, it is assumed that the p-type surface layer 114 of the pillar 113 serves as a second-direction body.

A memory block BLKi may include a plurality of pillars 113. That is, the memory block BLKi may include a plurality of NAND strings NS. In detail, the memory block BLKi may include a plurality of NAND strings NS extending along a second direction (or, a direction vertical to a substrate).

Each NAND string NS may include a plurality of transistor structures TS that are disposed along a second direction. At least one of the transistor structures TS of each NAND string NS may serve as a string selection transistor SST. At least one of the transistor structures TS of each NAND string NS may serve as a ground selection transistor GST.

Gates (or control gates) may correspond to conductive materials 211 through 291, 212 through 292, and 213 through 293 extending along a first direction. That is, the gates (or the control gates) may be extended in the first direction to form two selection lines (e.g., at least one string selection line SSL and at least one ground selection line GSL) and word lines extending along the first direction.

Conductive materials 331 through 333 extending in a third direction may be connected to one ends of the NAND strings NS, respectively. Conductive materials 331 through 333 may act as bit lines BL. In the memory block BLK1, one bit line may be connected with a plurality of NAND strings.

Second-type doping regions 311 through 314 extending in the first direction may be provided to other ends of the NAND strings NS, respectively. The second-type doping regions 311 through 314 may serve as common source lines CSL.

To sum up the above description, the memory block BLKi may include a plurality of NAND strings that extend in a direction (i.e., the second direction) vertical to the substrate 111, and may be a NAND flash memory block (e.g., a charge trap type) in which a plurality of NAND strings NS may be connected to one bit line BL.

FIGS. 9 through 11 were described under the assumption that first conductive lines 211 through 291, 212 through 292, and 213 through 293 extending along the first direction are formed at nine layers. However, at least some example embodiments of the present inventive concepts are not limited thereto. For example, conductive lines extending along the first direction may be provided at 8, 16, or plural layers. That is, one NAND string may include 8, 16, or plural transistors.

FIGS. 10 through 11 were described under the assumption that three NAND strings NS are connected to a bit line. However, at least some example embodiments of the present inventive concepts are not limited thereto. In example embodiments, in a memory block BLKi, m NAND strings NS may be connected to a bit line BL. At this time, the number of conductive materials 211 through 291, 212 through 292, and 213 through 293 extending along the first direction and the number of common source lines 311 through 314 may be adjusted according to the number of NAND strings NS connected to a bit line BL.

FIGS. 10 through 11 were described under the assumption that three NAND strings NS are connected to a conductive material extending along the first direction. However, at least some example embodiments of the present inventive concepts are not limited thereto. For example, n NAND strings NS may be connected to a conductive material extending along the first direction. At this time, the number of bit lines 331 through 333 may be adjusted according to the number of NAND strings connected to a bit line extending along the first direction.

Figure 12:
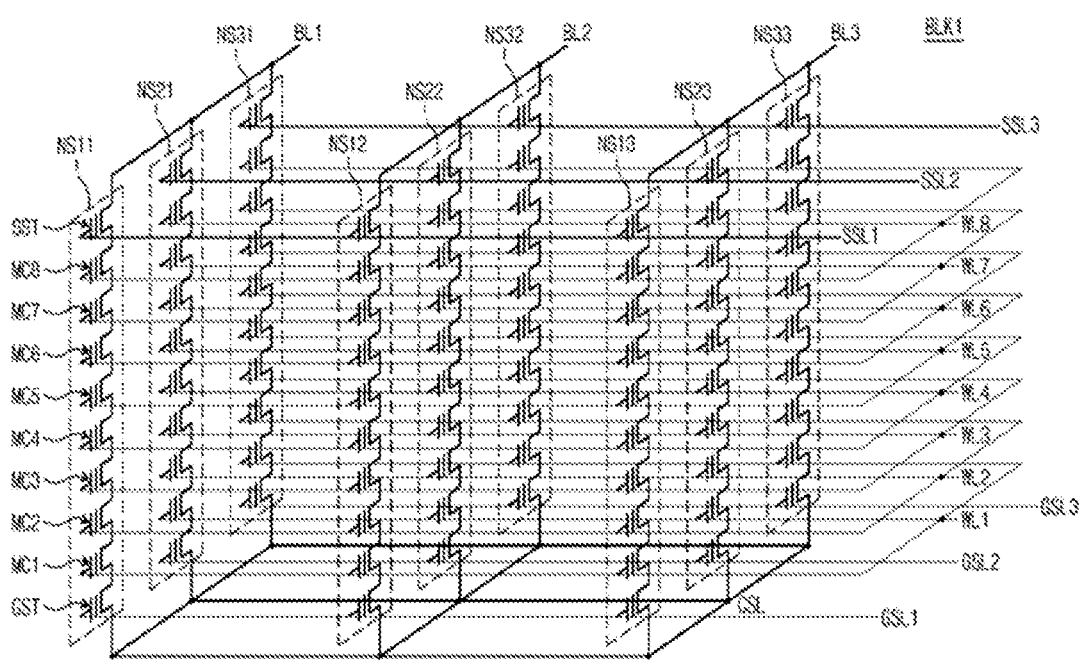
FIG. 12 is an equivalent circuit diagram for the memory block BLK1 described in FIGS. 9, 10 and 11.

FIG. 12 is an equivalent circuit diagram of a memory block described with reference to FIGS. 9 through 11.

Referring to FIGS. 9 through 12, NAND strings NS11, NS21, and NS31 may be provided between a first bit line BL1 and a common source line CSL. NAND strings NS12, NS22, and NS32 may be provided between a second bit line BL2 and the common source line CSL. NAND strings NS13, NS23, and NS33 may be provided between a third bit line BL3 and the common source line CSL. The first through third bit lines BL1 through BL3 may correspond to conductive material 331 through 333 extending in the third direction, respectively.

A string selection transistor SST of each NAND string NS may be connected to a corresponding bit line BL. A ground selection transistor GST of each NAND string NS may be connected to the common source line CSL. In each NAND string NS, memory cells MC may be provided between the string selection transistor SST and the ground selection transistor GST.

Below, NAND strings NS may be defined by the row and by the column. The NAND strings NS connected to one bit line in common may form one column. For example, the NAND strings NS11 through NS31 connected to the first bit line BL1 may correspond to a first column. The NAND strings NS12 through NS32 connected to the second bit line BL2 may correspond to a second column. The NAND strings NS13 through NS33 connected to the third bit line BL3 may correspond to a third column. The NAND strings NS connected to one string selection line SSL may form one row. For example, the NAND strings NS11 through NS13 connected to a first string selection line SSL1 may form a first row. The NAND strings NS21 through NS23 connected to a second string selection line SSL2 may form a second row. The NAND strings NS31 through NS33 connected to a third string selection line SSL3 may form a third row.

In each NAND string NS, a height may be defined. In example embodiments, in each NAND string NS, a memory cell MC1 adjacent to the ground selection transistor GST may be defined to have a height of 1. In each NAND string NS, a height of a memory cell may increase in inverse proportion to a distance from a string selection transistor SST. In each NAND string NS, a memory cell MC7 adjacent to the string selection transistor SST may be defined to have a height of 7.

NAND strings in the same row may share the string selection line SSL. NAND strings in different rows may be connected to different string selection lines SSL1, SSL2, and SSL3, respectively.

In each NAND string NS in the same row, memory cells having the same height may share a word line WL. At the same height, word lines WL connected to memory cells of NAND strings in different rows may be connected in common. The word line WL may be configured to be the memory cell layer. The block includes a plurality of memory cell layers stacked on a substrate and are electrically connected with other word lines Thus, treating the word line connected to the bad memory cell as the bad area may be treating the memory cell layer including the bad memory cell as the bad area.

In the same row of NAND strings NS, ground selection transistors GST may share a ground selection line GSL. In different rows of NAND strings NS, ground selection transistors GST may share the ground selection line GSL. That is, the NAND strings NS11 through NS13, NS21 through NS23, and NS31 through NS33 may be connected in common to the ground selection line GSL.

The common source line CSL may be connected in common to NAND strings NS. For example, first through fourth doping regions 311 through 314 may be interconnected at an active region of a substrate 111. For example, the first through fourth doping regions 311 through 314 may be connected to an upper layer via contacts. The first through fourth doping regions 311 through 314 may be connected in common at the upper layer.

As illustrated in FIG. 12, word lines placed at the same height may be connected in common. Thus, when a word line placed at a specific height is selected and all NAND strings connected with the selected word line may be selected. NAND strings in different rows may be connected to different string selection lines. Thus, NAND strings in an unselected row from among NAND strings connected with the same word line may be separated from a corresponding bit line by selecting the string selection lines SSL1 through SSL3. That is, a row of NAND strings may be selected by selecting and unselecting the string selection lines SSL1 through SSL3. A column of NAND strings in a selected row may be selected by selecting bit lines BL1 through BL3.

The three dimensional non-volatile memory device 1100 has more and more error bits because three dimensional non-volatile memory device 1100 has bigger capacity blocks and may have less reliable memory cells than planar non-volatile memory device. The memory controller 1200 may have an increased capability to perform error correction by changing soft decision offset and the sequential soft decision voltage. Thus, the memory controller 1200 improves reliability of the non-volatile memory device.

Figure 13:
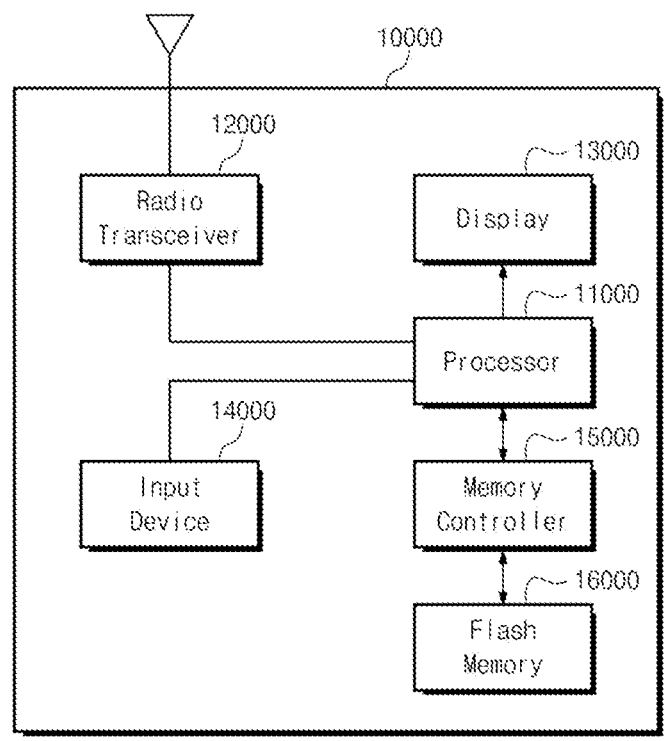
FIGS. 13, 14, 15, 16, 17 and 18 are respective block diagrams that variously illustrate electronic devices that may incorporate a memory system and/or a memory controller that is operated in accordance with at least some example embodiments of the inventive concepts.

FIG. 13 is a block diagram schematically illustrating an electronic device 10000 including a non-volatile memory device according to at least some example embodiments of the present inventive concepts.

Referring to FIG. 13, the electronic device 10000 such as a cellular phone, a smart phone, or a tablet PC may include a non-volatile memory device 16000 formed of a flash memory device and a memory controller 15000 controlling an operation of the non-volatile memory device 16000.

The non-volatile memory device 16000 may be or include, for example, the non-volatile memory device 1100 of FIG. 1. The non-volatile memory device 16000 may be configured to verify programming of first data pattern using a first memory cell storing the first data pattern, a second memory cell programmed using a program voltage, and a verification voltage corresponding to the first data pattern. When a verification result of the first memory cell indicates a pass, programming of the second memory cell may be ended.

The memory controller 15000 may be or include, for example, the memory controller 1200 of FIG. 1. The memory controller 15000 may be controlled by a processor 11000 controlling an overall operation of the electronic device 10000.

Data stored in the non-volatile memory device 16000 may be displayed via a display 13000 under the control of the memory controller 15000 that operates in response to the control of a processor 11000.

A radio transceiver 12000 may transmit and receive a radio signal via an antenna. For example, the radio transceiver 12000 may convert a radio signal received via the antenna to a signal suitable for the processor 11000 to process. The processor 11000 may process a signal output from the radio transceiver 12000, and the processed signal may be stored in the non-volatile memory device 16000 via the memory controller 15000 or displayed via the display 13000.

The radio transceiver 12000 may convert a signal from the processor 11000 to a radio signal to output it to an external device via the antenna.

An input device 14000 may be a device capable of receiving a control signal for controlling an operation of the processor 11000 or data to be processed by the processor 11000. The input device 14000 may include a pointing device such as a touch pad or a computer mouse, a keypad, or a keyboard.

The processor 11000 may control the display 13000 so as to display data output from the non-volatile memory device 16000, a radio signal from the radio transceiver 12000, or data from the input device 14000.

Figure 14:
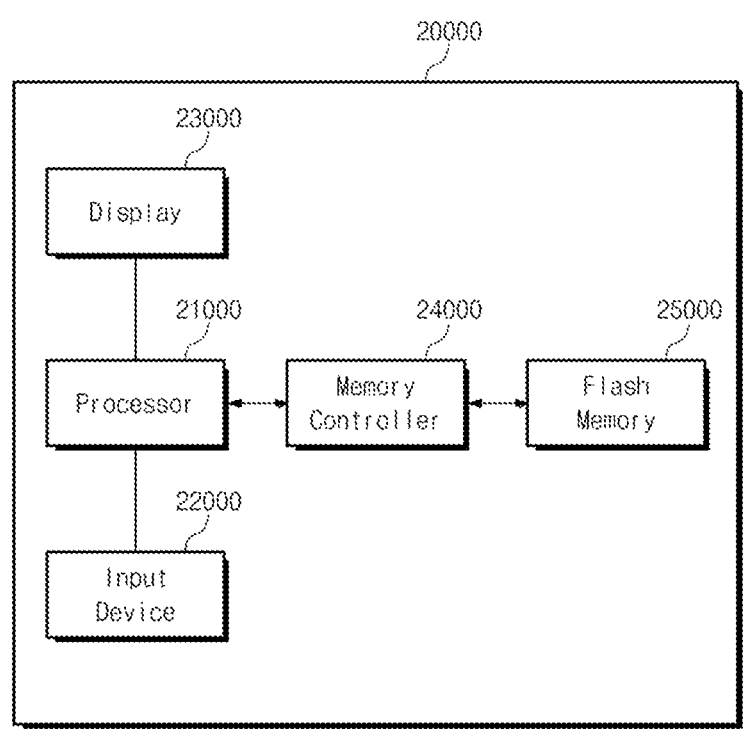

FIG. 14 is a block diagram schematically illustrating an electronic device 20000 including a memory controller and a non-volatile memory device according to at least some example embodiments of the present inventive concepts.

Referring to FIG. 14, an electronic device 20000 may be a data processing device such as a personal computer, a tablet computer, a net-book, an e-reader, a PDA, a PMP, an MP3 player, or an MP4 player, and may include a non-volatile memory device 25000 such as a flash memory device and a memory controller 24000 controlling an operation of the non-volatile memory device 25000.

The non-volatile memory device 25000 may correspond to a non-volatile memory device described in relation to FIG. 1 including, for example, the nonvolatile memory device 1100. The non-volatile memory device 25000 may be configured to verify programming of first data pattern using a first memory cell storing the first data pattern, a second memory cell programmed using a program voltage, and a verification voltage corresponding to the first data pattern. When a verification result of the first memory cell indicates a pass, programming of the second memory cell may be ended.

The memory controller 24000 may correspond to a memory controller illustrated in FIG. 1 including, for example, the memory controller 1200. The electronic device 20000 may include a processor 21000 controlling an overall operation of the electronic device 20000. The memory controller 24000 may be controlled by the processor 21000.

The processor 21000 may display data, stored in a non-volatile memory device, via a display according to an input signal generated by an input device 22000. For example, the input device 22000 may be formed of a pointing device such as a touch pad or a computer mouse, a keypad, or a keyboard.

Figure 15:
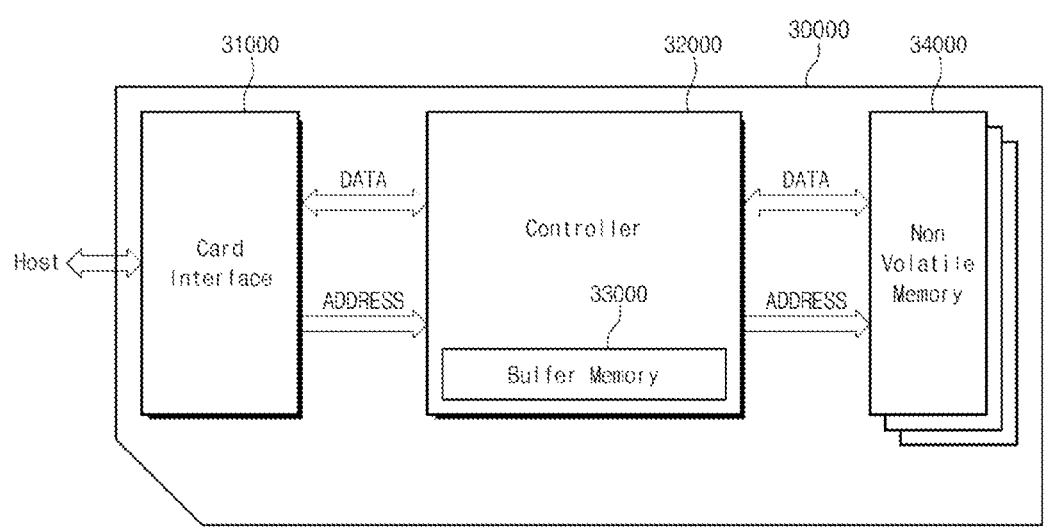

FIG. 15 is a block diagram schematically illustrating an electronic device including a non-volatile memory device according to at least some example embodiments of the present inventive concepts. Referring to FIG. 15, an electronic device 30000 may include a card interface 31000, a memory controller 32000, and at least one non-volatile memory device 34000, for example, a flash memory device.

The electronic device 30000 may exchange data with a host via card interface 31000. In example embodiments, the card interface 31000 may be an SD card interface or an MMC interface. However, at least some example embodiments of the present inventive concepts are not limited thereto. The card interface 31000 may exchange data between the host and the memory controller 32000 according to the communication protocol of the host capable of communicating with the electronic device 30000.

The memory controller 32000 may control an overall operation of the electronic device 30000, and may control data exchange between the card interface 31000 and the non-volatile memory device 34000. A buffer memory 33000 of the memory controller 32000 may buffer data transferred between the card interface 31000 and the at least one non-volatile memory device 34000.

The memory controller 32000 may be connected to the card interface 31000 and the non-volatile memory device 34000 via a data bus and an address bus. In example embodiments, the memory controller 32000 may receive an address of data to be read or written via the address bus from the card interface 31000 to send it to the at least one non-volatile memory device 34000.

The memory controller 32000 may receive or send data to be read or to be written via the data bus connected to the card interface 31000 or the at least one non-volatile memory device 34000.

The at least one non-volatile memory device 34000 may correspond to a non-volatile memory device described in relation to FIG. 1 including, for example, the non-volatile memory device 1100. The at least one non-volatile memory device 34000 may be configured to verify programming of first data pattern using a first memory cell storing the first data pattern, a second memory cell programmed using a program voltage, and a verification voltage corresponding to the first data pattern. When a verification result of the first memory cell indicates a pass, programming of the second memory cell may be ended. The memory controller 32000 may correspond to a memory controller illustrated in FIG. 1 including, for example, the memory controller 1200.

When the electronic device 30000 in FIG. 15 is connected to a host such as a PC, a tablet PC, a digital camera, a digital audio player, a cellular phone, a console video game hardware, or a digital set-top box, the host may send or receive data stored in the non-volatile memory device 34000 via the card interface 31000 and the memory controller 32000.

Figure 16:
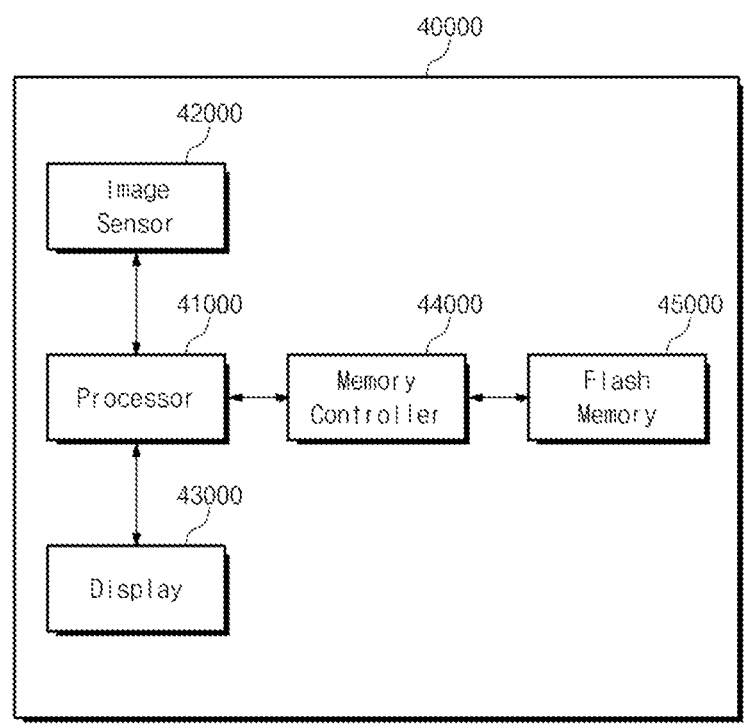

FIG. 16 is a block diagram schematically illustrating an electronic device including a memory controller and a non-volatile memory device according to at least some example embodiments of the present inventive concepts. Referring to FIG. 16, an electronic device 40000 may include a non-volatile memory device 45000 such as a flash memory device, a memory controller 44000 controlling a data processing operation of the non-volatile memory device 45000, and a processor 41000 controlling an overall operation of the electronic device 40000.

The non-volatile memory device 45000 may correspond to a non-volatile memory device described in relation to FIG. 1 including, for example, the non-volatile memory device 1100. The non-volatile memory device 45000 may be configured to verify programming of first data pattern using a first memory cell storing the first data pattern, a second memory cell programmed using a program voltage, and a verification voltage corresponding to the first data pattern. When a verification result of the first memory cell indicates a pass, programming of the second memory cell may be ended. The memory controller 44000 may correspond to a memory controller illustrated in FIG. 1 including, for example, the memory controller 1200.

An image sensor 42000 of the electronic device 40000 may convert an optical signal to a digital signal, and the digital signal may be stored in the non-volatile memory device 45000 or displayed via a display 43000 under the control of the processor 41000.

Figure 17:
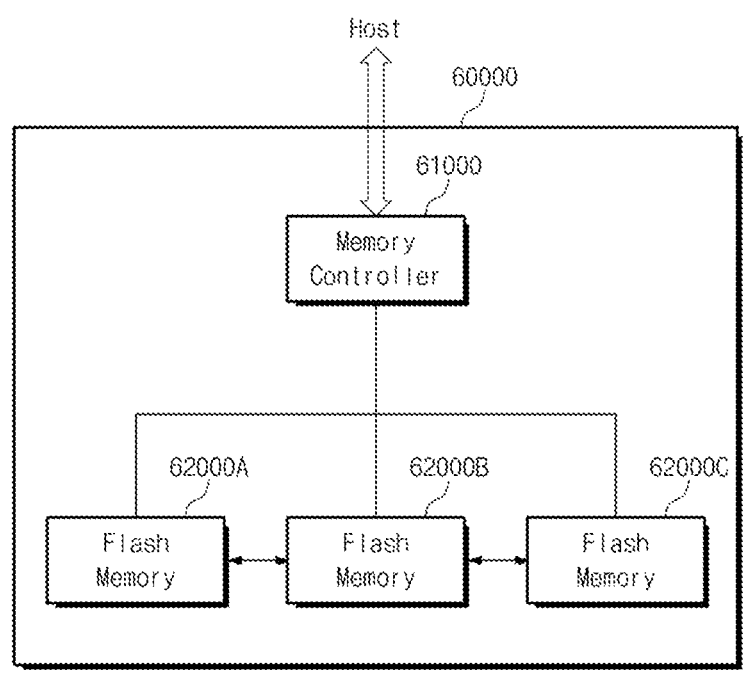

FIG. 17 is a block diagram schematically illustrating an electronic device including a memory controller and non-volatile memory devices according to at least some example embodiments of the present inventive concepts. Referring to FIG. 17, an electronic device 60000 may be implemented by a data storage device such as a Solid State Drive (SSD).

The electronic device 60000 may include a plurality of non-volatile memory devices 62000A, 62000B, and 62000C and a memory controller 61000 controlling a data processing operation of each of the plurality of non-volatile memory devices 62000A, 62000B, and 62000C. The electronic device 60000 may be implemented by a memory system or a memory module.

Each of the non-volatile memory devices 62000A, 62000B, and 62000C may be a non-volatile memory device described in FIGS. 1 and 2 including, for example, the non-volatile memory device 1100. Each of the non-volatile memory devices 62000A, 62000B, and 62000C may be configured to verify programming of first data pattern using a first memory cell storing the first data pattern, a second memory cell programmed using a program voltage, and a verification voltage corresponding to the first data pattern. When a verification result of the first memory cell indicates a pass, programming of the second memory cell may be ended. The memory controller 61000 may correspond to a memory controller illustrated in FIG. 1 including, for example, the memory controller 1200.

In example embodiments, the memory controller 61000 may be provided at the interior or exterior of the electronic device 60000.

Figure 18:
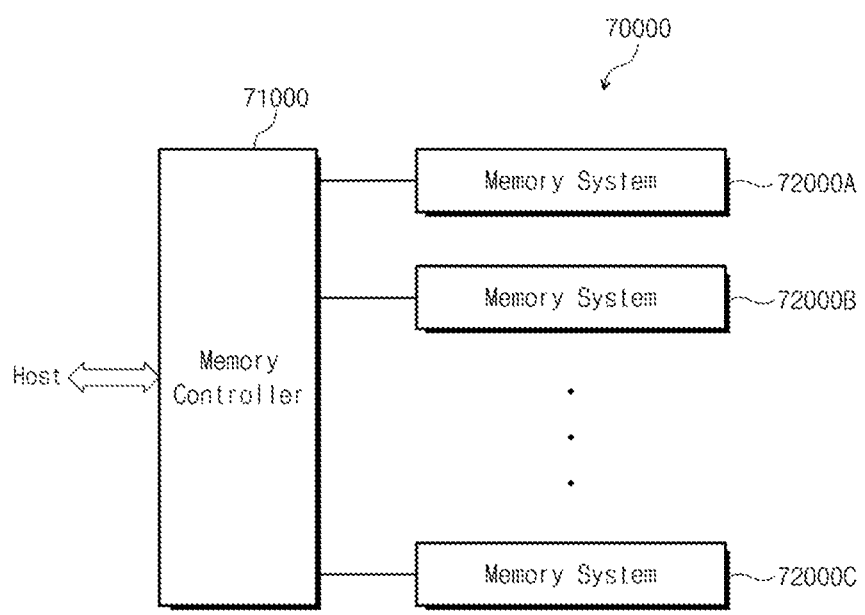

FIG. 18 is a block diagram schematically illustrating a data processing system including an electronic device in FIG. 17. Referring to FIGS. 22 and 23, a data storage device 70000 may be implemented by a RAID (Redundant Array of Independent Disks) system, and may include a RAID controller 71000 and a plurality of memory systems 72000A to 72000C.

The memory systems 72000A to 72000C may be an electronic device 60000 illustrated in FIG. 17. The memory systems 72000A to 72000C may constitute a RAID array. The data storage device 70000 may be implemented by a personal computer or an SSD.

During a program operation, the RAID controller 71000 may output program data from a host to one of the memory systems 72000A to 72000C according to a RAID level, selected depending on RAID level information from the host, from among a plurality of RAID levels.

During a read operation, the RAID controller 71000 may provide the host with data read from one of the memory systems 72000A to 72000C according to a RAID level, selected depending on RAID level information from the host, from among a plurality of RAID levels.

Example embodiments having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:
1. A method of operating a memory controller, the method comprising:
    receiving hard decision data and first soft decision data from a non-volatile memory device;
    performing a plurality of iterations of a first error correction code (ECC) decoding operation using the hard decision data and the first soft decision data; and
    determining a second soft decision read voltage or determining to perform a reclaim operation of the non-volatile memory device based on a number of iterations, the number of iterations indicating how many iterations of the first ECC decoding operation are included in the plurality of iterations.
2. The method of claim 1, wherein the first ECC decoding operation uses iterative code.

3. The method of claim 2, wherein the iterative code is LDPC (low density parity check) code.

4. The method of claim 1, wherein the determining a second soft decision read voltage or determining to perform a reclaim operation includes performing the reclaim operation when the first ECC decoding operation succeeds and an error bit of the hard decision data is corrected.

5. The method of claim 1, wherein the determining a second soft decision read voltage or determining to perform a reclaim operation includes determining the second soft decision read voltage when the first ECC decoding operation fails.

6. The method of claim 1, further comprising:
performing a second ECC decoding operation using a second soft decision data read using the second soft decision read voltage.

7. The method of claim 1, wherein the determining a second soft decision read voltage or determining to perform a reclaim operation includes determining the second soft decision read voltage by referring to a look up table indicating a correlation between the number of iterations and a ratio of strong error bits.

8. The method of claim 7, wherein the referring to a look up table includes accessing a read only memory (ROM) storing the look up table.

9. The method of claim 1, further comprising:
performing a first soft decision read operation to receive the first soft decision data, the first soft decision read operation being performed by using a soft decision offset.

10. A method of operating a memory controller, the method comprising:
performing a first soft decision read operation;
receiving hard decision data and first soft decision data from a non-volatile memory device, the first soft decision data being received as a result of the first soft decision read operation;
performing a plurality of iterations of a first error correction code (ECC) decoding operation using the hard decision data and the first soft decision data; and
determining, when the first ECC decoding operation fails, an offset of a second soft decision read operation subsequent to performing the first soft decision read operation,
the determining being based on a number of iterations, the number of iterations indicating how many iterations of the first ECC decoding operation are included in the plurality of iterations.

11. The method of claim 10, wherein the first ECC decoding operation uses an iterative code.

12. The method of claim 11, the iterative code is a low density parity check (LDPC) code.

13. The method of claim 10, wherein the determining comprises:
determining the offset of the second soft decision read operation to have a first value when the number of iterations is bigger than a reference value; and
determining the offset of the second soft decision read operation to have a second value when the number of iterations is not bigger than the reference value, the first value being bigger than the second value.

14. The method of claim 10, wherein the determining an offset includes determining the offset such that the absolute value of the offset is proportional to the number of iterations.

15. The method of claim 10, wherein the offset determines a log likelihood ratio (LLR) of ECC decoding.

16. The method of claim 10, wherein the determining an offset includes referring to a look up table indicating a correlation between the number of iteration operation and a ratio of strong error bits.

17. The method of claim 10, further comprising:
performing the second soft decision read operation using the offset.

18. A method of operating a memory controller, the method comprising:
performing a hard decision reading operation by reading hard decision data from a nonvolatile memory device;
performing a first soft decision reading operation by reading first soft decision data from the nonvolatile memory device using a first soft decision reading voltage;
performing a first number of iterations of a first error correction code (ECC) decoding operation using the hard decision data and first soft decision data;
determining, at the memory controller, a second soft decision reading voltage based on the first number of iterations; and
performing a second soft decision reading operation by reading second soft decision data from the nonvolatile memory device using the determined second soft decision reading voltage.

19. The method of claim 18, wherein determining, at the memory controller, a second soft decision reading voltage based on the first number of iterations comprises:
accessing a look up table (LUT) that indicates relationships between a plurality of numbers of iterations of the first ECC code decoding operation and corresponding ones of a plurality of ratio values, respectively;
determining, at the memory controller, a ratio value from among the plurality of ratio values that corresponds to the first number of iterations according to the LUT; and
determining the second soft decision reading voltage based on the ratio value that corresponds to the first number of iterations.

20. The method of claim 19, wherein the ratio value is a ratio of a number of strong error bits to a total number of error bits in the first soft decision data, the strong error bits being bits associated with threshold values of memory cells of the nonvolatile memory device that result in read errors when read using a hard decision reading voltage and when read using the first soft decision reading voltage.

* * * * *